United States Patent
Lee

(10) Patent No.: US 8,217,430 B2
(45) Date of Patent: *Jul. 10, 2012

(54) POWER LINE LAYOUT TECHNIQUES FOR INTEGRATED CIRCUITS HAVING MODULAR CELLS

(75) Inventor: Cheng Hung Lee, Houko (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/786,003

(22) Filed: May 24, 2010

(65) Prior Publication Data

US 2010/0230726 A1    Sep. 16, 2010

Related U.S. Application Data

(62) Division of application No. 11/529,925, filed on Sep. 30, 2006, now Pat. No. 7,750,375.

(51) Int. Cl.
*H01L 27/10* (2006.01)

(52) U.S. Cl. .................. 257/207; 257/E23.153

(58) Field of Classification Search .......... 257/691–692, 257/750, 207–211, 758, 723, 685, E23.153, 257/E23.144, E27.07
See application file for complete search history.

(56) References Cited

U.S. PATENT DOCUMENTS

| | | | | |
|---|---|---|---|---|
| 7,196,363 | B2* | 3/2007 | Montagnana | 257/207 |
| 7,414,917 | B2* | 8/2008 | Ruckerbauer et al. | 365/233.13 |
| 7,750,375 | B2* | 7/2010 | Lee | 257/207 |

OTHER PUBLICATIONS

Doong, Kelvin Y.Y., et al., "Field Configurable Test Structure Array (FC-TSA): Enabling design for monitor, model and manufacturability", IEEE Int'l . . . Mar. 6-9, 2006.

* cited by examiner

*Primary Examiner* — Hoa B Trinh
(74) *Attorney, Agent, or Firm* — K&L Gates LLP

(57) ABSTRACT

An integrated circuit (IC) chip includes a first memory cell array block having a first metal layer containing at least two power lines, and a second memory cell array block containing at least two power lines independent of each other, wherein all the power lines on the first metal layer serving the first memory cell array block do not extend into the second memory cell array block, and all the power lines on the first metal layer serving the second memory cell array block do not extend into the first memory cell array block.

18 Claims, 4 Drawing Sheets

US 8,217,430 B2

POWER LINE LAYOUT TECHNIQUES FOR INTEGRATED CIRCUITS HAVING MODULAR CELLS

CROSS REFERENCE

This application is a Divisional Application of U.S. Ser. No. 11/529,925, filed on Sep. 30, 2006, and entitled "POWER LINE LAYOUT TECHNIQUES FOR INTEGRATED CIRCUITS HAVING MODULAR CELLS."

BACKGROUND

The present invention relates generally to a layout design for integrated circuit (IC), and, more particularly, to a method for power line layout in modular ICs.

IC layout is the representation of an integrated circuit in terms of planar geometric shapes that correspond to shapes actually drawn on photo-masks used in semiconductor device fabrication.

Power supply voltages are typically supplied to an IC chip from an external power supply source. The power supply voltages connect to the IC chip through bond pads on the IC chip. The power supply voltages are routed from the bond pads to transistors in the IC chip through metal lines and vias formed in one or more metal layers.

Since the metal lines have resistance, transistors at an end of a long metal line will have a lower power supply voltage than transistors at the beginning of the long metal lines. The speed of transistors depends in part on the magnitude of the power supply voltages they receive. Differences in power supply voltages can cause timing problems such as clock skew or increased propagation delay of gates and flip-flops. So proper power line layout is very important to the performance of the IC chips, especially when the chip size is relatively big.

One kind of power line routing is to run a ring-type power line along a peripheral of each section of the chip.

Traditional power ring structures at the edges of an IC chip form the backbone of the power distribution system. The metal lines extend from the ring structures to the center of the IC chip. The metal lines are then coupled to transistors. One drawback of this kind of power routing scheme is the voltage drop at the center of the IC chip due to the resistance of metal lines. Another draw back is that running a power ring may increase area overhead.

Power mesh is another traditional way of power routing, in which multiple parallel power lines are routed from one side of the IC chip to the other. A disadvantage with this kind of power routing scheme is that the power lines are routable only in one direction. Signal lines in the same metal layer as the power lines are also routable in only one direction.

As such, what is desired is an efficient power line routing scheme that allows both the power lines and the signal lines routable in both horizontal and vertical directions.

SUMMARY

This invention discloses an integrated circuit (IC) chip having a plurality of memory cell array blocks. The IC chip includes a first memory cell array block having a first set of power lines including at least a pair of a positive high supply voltage (Vdd) line and a complementary low supply voltage (Vss) line, the Vdd and the Vss lines being formed on a first metal layer. The IC chip further includes a second memory cell array block having a second set of power lines including at least a pair of the Vdd and the Vss lines, the second memory cell array block being disposed next to the first memory cell array block, wherein the power lines have both horizontal sections and vertical sections on a same power line. In addition, the IC chip includes a cell partition area disposed between the first and the second memory cell array blocks, and at least one signal line formed on the first metal layer, wherein no power lines serving the first or the second memory cell array block are routed across the cell partition area, such that the at least one signal line on the first metal layer is routed in both horizontal and vertical directions across the cell partition area.

The construction and method of operation of the invention, however, together with additional objectives and advantages thereof will be best understood from the following description of specific embodiments when read in connection with the accompanying drawings.

DESCRIPTION

The present invention discloses efficient power line routing schemes that allows both the power lines and the signal lines routable in both horizontal and vertical directions.

Figure 1A:
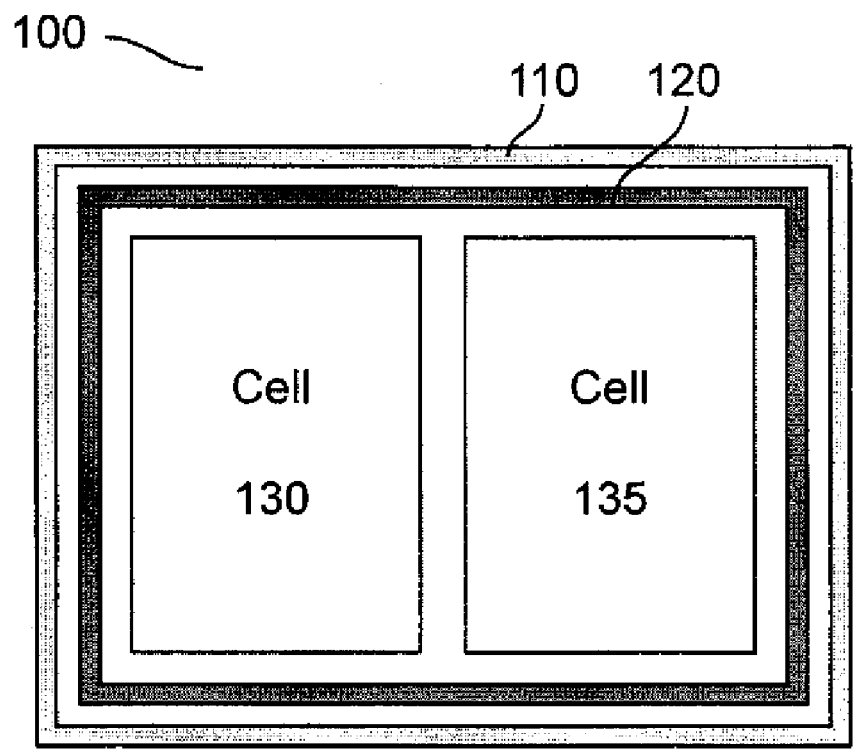
FIGS. 1A and 1B illustrate conventional power line routings, power ring and power mesh, respectively.

FIG. 1A illustrates a conventional power ring routing scheme for an exemplary integrated circuit (IC) chip 100 with just two modular cells 130 and 135. The modular cell 130 or 135 can be a memory cell array block or a functional block of a complex logic chip. The memory can be a static random access memory (SRAM), dynamic random access memory (DRAM) or a nonvolatile memory such as Flash memory, magnetoresistive random access Memory (MRAM) or Parameter Random Access Memory (PRAM). The logic chip can be function blocks in a system-on-chip (SoC). Such function blocks may be analog circuit blocks, digital circuit blocks or memory cell blocks in the SoC chip. The power ring structure has one high supply voltage (Vdd) ring 110 and a complementary low supply voltage (Vss) ring 120 at the edges of the IC chip 100. Metal lines extend from the Vdd ring 110 and Vss ring 120 to the center of the IC chip 100. The metal lines are then coupled to transistors. One drawback of this kind of power routing scheme is that the voltage drop at the center of the IC chip 100 is due to the resistance of metal lines. Another draw back is that running a power ring around the chip 100 may increase area overhead.

Figure 1B:
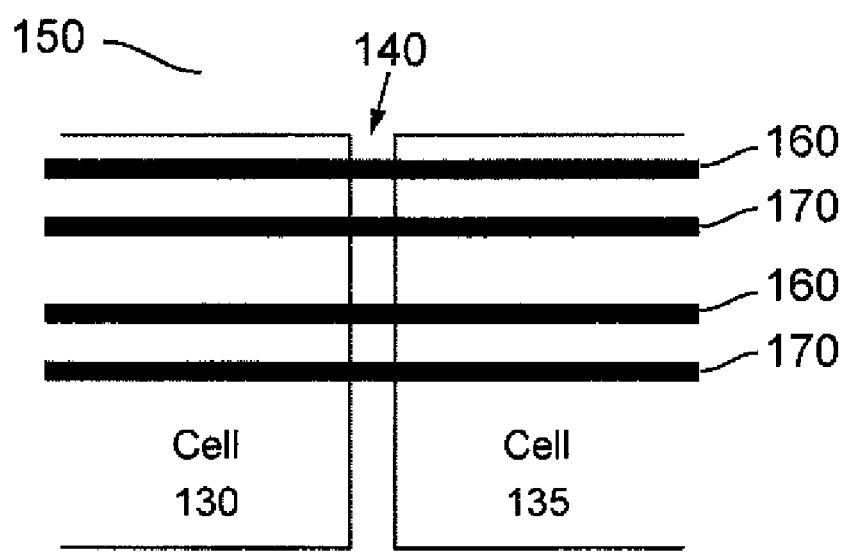

FIG. 1B illustrates a conventional power mesh routing scheme for another exemplary IC chip 150 with the two modular cells 130 and 135. Multiple parallel power lines 160s and 170s are routed from one side of the IC chip to the other. If the power lines 160s represent Vdd, then the power lines 170s represent Vss. The power lines 160s and 170s extend across a cell partition area 140 of the modular cells 130 and 135, and blocks any vertical line in the same metal layer. A disadvantage with this kind of power routing scheme is that the power lines 160s and 170s are routable only in one direction (horizontal shown in FIG. 1B). Signal lines in the same metal layer as the power lines 160s and 170s are also routable in only one direction. For signal lines that need to travel in both horizontal and vertical directions, coupling through vias and other layers of metal will be needed, which is less efficient and adds additional resistance and capacitance.

Figure 2A:
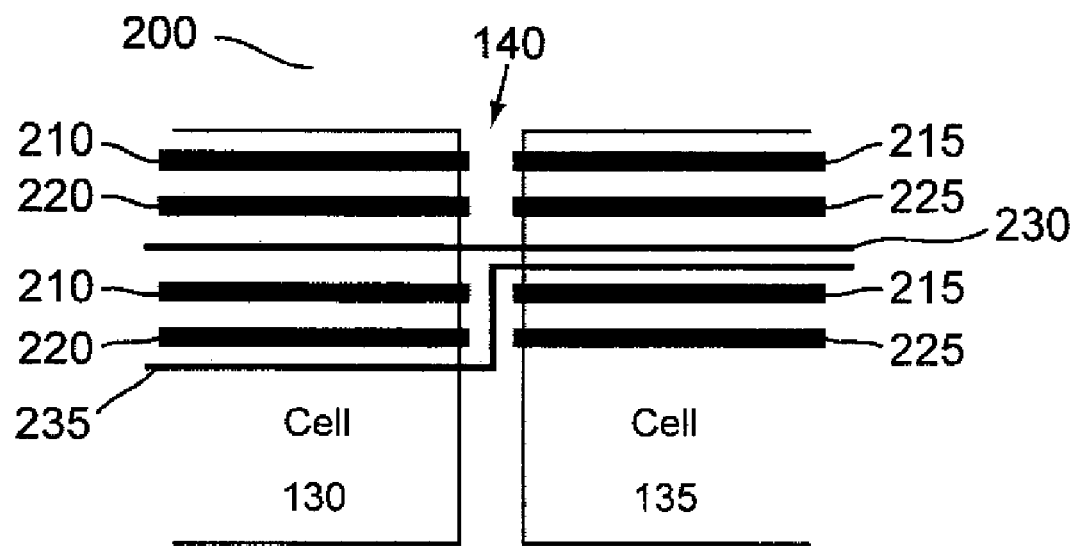
FIGS. 2A, 2B, 3A, 3B, 4 and 5 illustrate power line routings that allow both power lines and signal lines routable in both horizontal and vertical directions according to embodiments of the present invention.
Figure 2B:
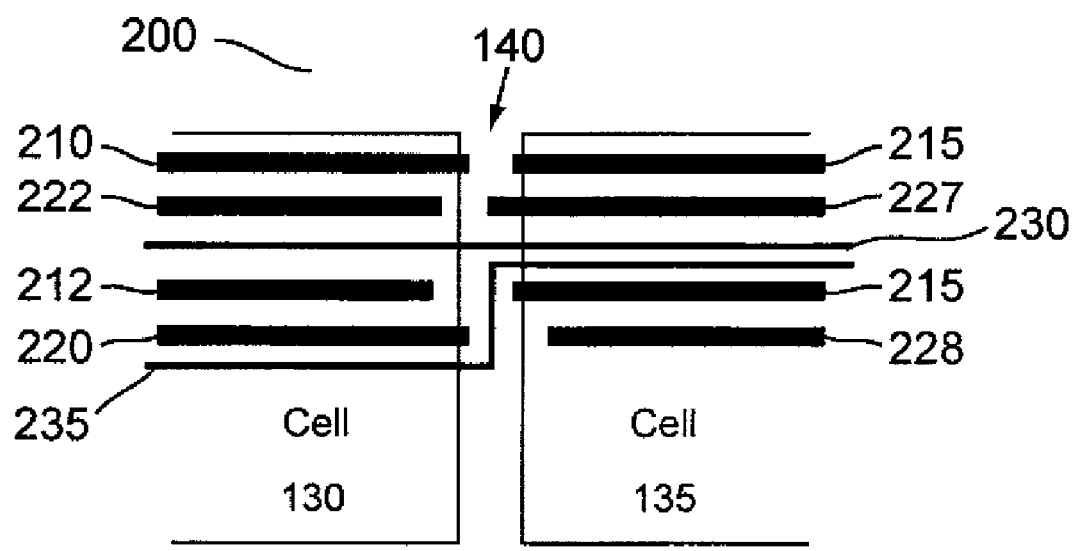

FIGS. 2A and 2B illustrate a new power mesh routing scheme where a power line from the modular cell 130 does not run through the cell partition area 140 into the juxtaposed modular cell 135 according to one embodiment of the present invention. A difference between FIG. 2A and FIG. 2B is that the ends of the power lines 210 and 220 or 215 and 225 in FIG. 2A are vertically aligned to each other, respectively, while the ends of the power lines 210, 222, 212 and 220 or 215, 227, 215 and 228 in FIG. 2B are not vertically aligned, respectively. This difference shows that the vertical alignment of the power lines are not required by the present invention, as long as they do not travel from one cell to the other. As FIG. 2B is only to show this difference, only descriptions of FIG. 2A are needed.

Referring to FIG. 2A for illustration purpose, the horizontal Vdd line 210 and Vss line 220 form a pair of power lines for the modular cell 130. Horizontal Vdd line 215 and Vss line 225 form a pair of power lines for the modular cell 135. The cell partition area 140 is cleared of and horizontal power lines, so that signal lines can run vertically through the cell partition area 140. Referring to FIG. 2, a signal line 230 runs horizontally from the modular cell 130 to the modular cell 135. Another signal line 235 also runs from the modular cell 130 to the modular cell 135, but has a vertical portion in the cell partition area 140. Here, the signal lines 230 and 235 shows feasibilities that signal lines can run in both horizontal and vertical directions across cell partition areas.

Figure 3A:
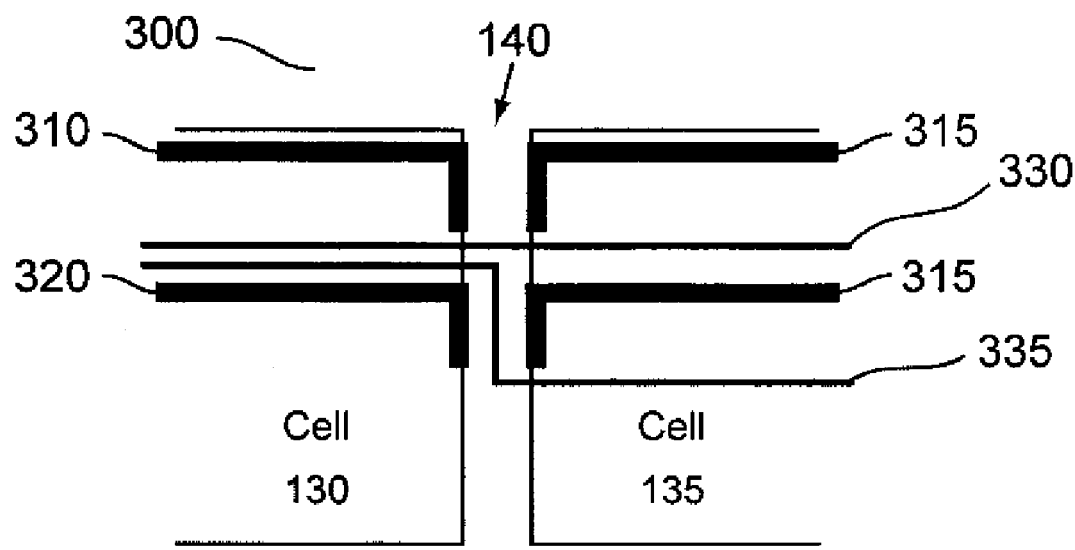
Figure 3B:
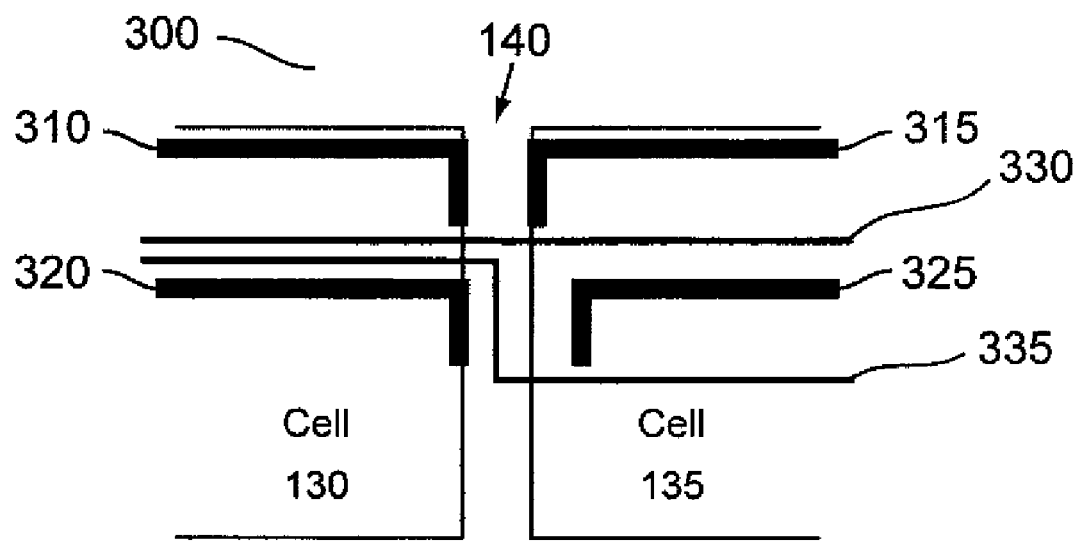

FIGS. 3A and 3B illustrate another power routing scheme according to another embodiment of the present invention. Again, a difference between FIG. 3A and FIG. 3B is that the ends of the power lines 310 and 320 or 315 in FIG. 3A are vertically aligned to each other, respectively, while the ends of the power lines 315 and 325 in FIG. 3B are not vertically aligned to each other. This difference shows that the vertical alignment of the power lines are not required by the present invention, as long as they do not travel from one cell to the other. As FIG. 3B is only to show this difference, only descriptions of FIG. 3A are needed.

Referring to FIG. 3A, the power lines 310 and 320 of the modular cell 130 do not go across to the juxtaposed modular cell 135, and power lines 315 of the modular cell 135 do not go across to the juxtaposed modular cell 130. Further more, the power lines 310, 320, and 315 have not only horizontal sections, but also vertical sections on a same power line. An advantage for this kind of two directional power line routing is that it can offer more uniform power line reaches to transistors across the modular cell 130 or 135. Referring to FIG. 3, a signal line 330 can go across from one modular cell to another horizontally, and at the same time a signal line 335 has a vertical travel addition to horizontal travels.

Referring to FIG. 3A, the modular cell 130 or 135 must have at least two power lines, one for Vdd and the other for Vss.

Figure 4:
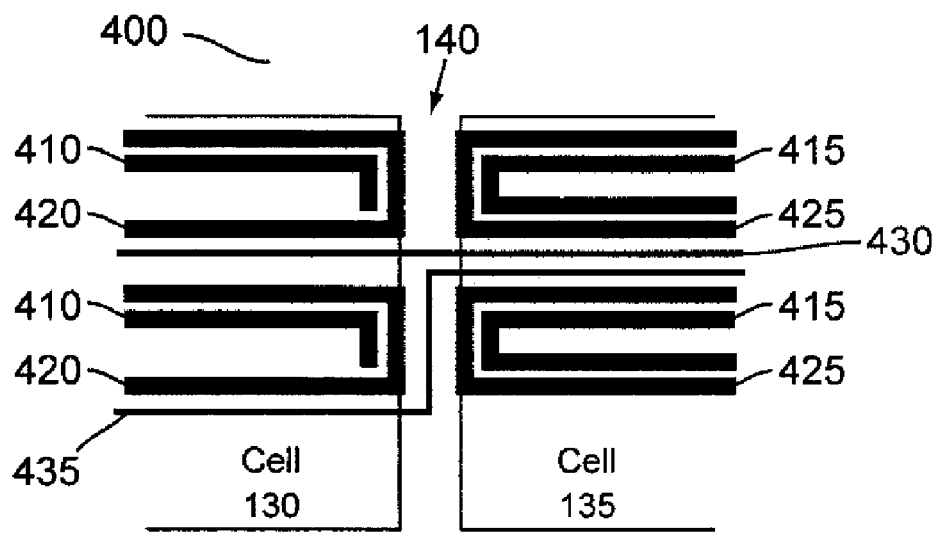
Figure 5:
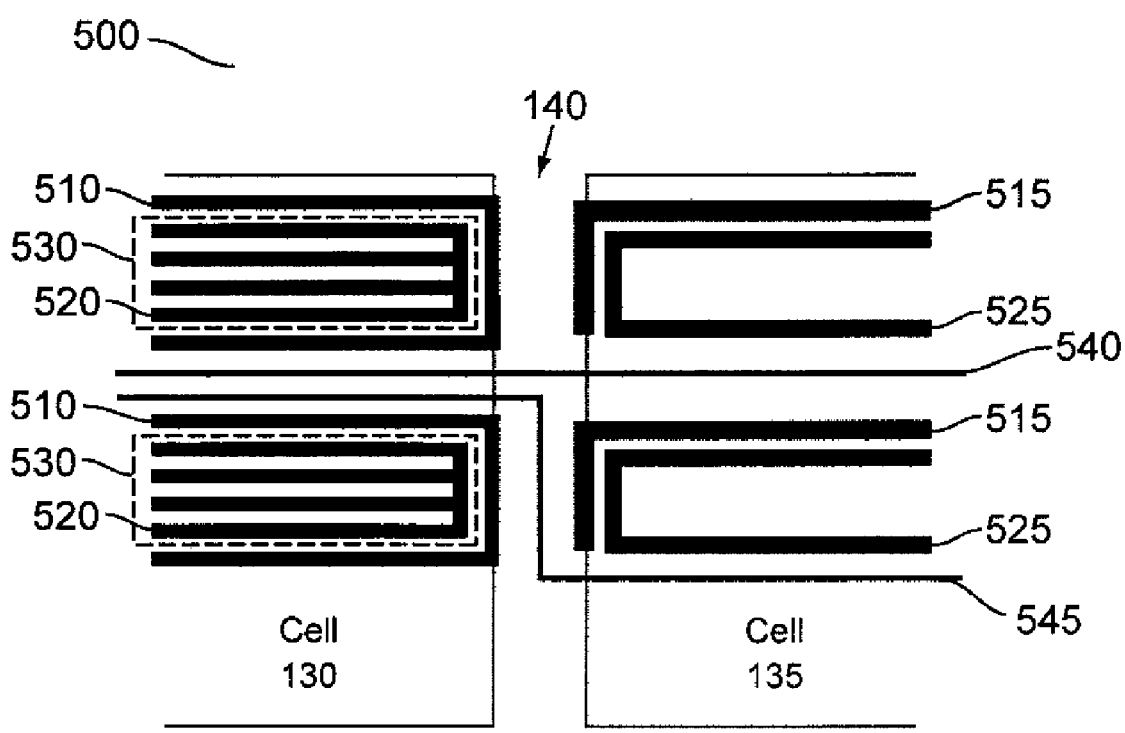

FIGS. 4 and 5 show additional alternative power line routing schemes according to embodiments of the present invention. The underline principles are still the same as that applied in chips shown in FIGS. 2 and 3. First, a power line within a modular cell does not go across the cell partition area 140 into a juxtaposed modular cell. Second, both power lines and signal lines can travel in both horizontal and vertical directions.

Referring to FIG. 5, particularly, a region 530 in the modular cell 130 power lines 520 are more densely routed. Because the region 530 is an area where vias can be placed to connect to other metal layers, so in order to reduce resistances of the power lines, a power line 520 is placed as a denser mesh, so that the power line 520 can make more coupling through the vias to underlying transistors.

Referring to FIGS. 3~5, the power line routing schemes do not have to be the same among two juxtaposed modular cells. The power line routing scheme follows functional requirements of a modular cell.

Referring to FIGS. 3~5, even though the power lines stop at the cell partition area 140, but they can still be connected through vias and metal lines in other metal layers.

Practically, the width of a cell partition area 140 is less than about 60 um. The line width of the signal lines is less than about 0.3 um. The space of power lines (Vdd to Vss) is less than about 50 um. The voltage level of the 1st and 2nd modular cell will be the same or not the same voltage level.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit (IC) chip having a plurality of memory cell array blocks, the IC chip comprising:
   a first memory cell array block having a first set of power lines including at least a pair of a positive high supply voltage (Vdd) line and a complementary low supply voltage (Vss) line, the Vdd and the Vss lines being formed on a first metal layer;
   a second memory cell array block having a second set of power lines including at least a pair of the Vdd and the Vss lines, the second memory cell array block being disposed next to the first memory cell array block, wherein the power lines have both horizontal sections and vertical sections on a same power line;
   a cell partition area disposed between the first and the second memory cell array blocks; and
   at least one signal line formed on the first metal layer,
   wherein no power lines serving the first or the second memory cell array block are routed across the cell partition area, such that the at least one signal line on the first metal layer is routed in both horizontal and vertical directions across the cell partition area.

2. The chip of claim 1, wherein the power lines extend in both horizontal and vertical direction within the first or second memory cell array block.

3. The chip of claim 1, wherein at least one signal line on the first metal layer is routed between two adjacent power lines serving the first or second modular cell.

4. The chip of claim 1, wherein at least one signal line on the first metal layer has one or more sections routed through the cell partition area.

5. The chip of claim 1, wherein a width of the cell partition area is less than about 60 um.

6. The chip of claim 1, wherein a space between the power lines (Vdd to Vss) is less than about 50 um.

7. The chip of claim 1, wherein a line width of the at least one signal line is less than about 0.3 um.

8. An integrated circuit (IC) chip having a plurality of memory cell array blocks, the chip comprising:
- a first memory cell array block having a first set of power lines including at least a pair of a positive high supply voltage (Vdd) line and a complementary low supply voltage (Vas) line, the Vdd and Vss lines being formed on a first metal layer;
- a second memory cell array block having a second set of power lines including at least a pair of the Vdd and Vss lines, the second memory cell array block being disposed next to the first memory cell array block;
- a predetermined partition area disposed between the first and second memory cell array blocks; and
- at least one signal line formed on the first metal layer,
- wherein all the Vdd. and Vss lines on the first metal layer serving the first memory cell array block do not extend into the second memory cell array block across the predetermined partition area, and all the Vdd and Vss lines on the first metal layer serving the second memory cell array block do not extend into the first modular cell across the predetermined partition area, and
- wherein the at least one signal line is routed in both horizontal and vertical directions across the predetermined partition area, and the Vdd and Vss power lines have both horizontal section and vertical section on a same power line.

9. The chip of claim 8, wherein the at least one signal line on the first metal layer is routed between two adjacent power lines serving the first or second memory cell array block.

10. The chip of claim 8, wherein the at least one signal line on the first metal layer has one or more sections routed through the predetermined partition area.

11. The chip of claim 8, wherein a width of the predetermined partition area is less than about 60 um.

12. The chip of claim 8, wherein a space between the Vdd and Vss lines is less than about 50 um.

13. The chip of claim 8, wherein a line width of the at least one signal line is less than about 0.3 um.

14. A semiconductor memory chip having a plurality of functional blocks, the memory chip comprising:
- a first functional block having a first set of power lines including at least a pair of a positive high supply voltage (Vdd) line and a complementary low supply voltage (Vss) line, the Vdd and Vss lines being formed on a first metal layer;
- a second functional block having a second set of power lines including at least a pair of the Vdd and Vss lines, the second functional block being disposed next to the first functional block, wherein the Vdd and Vss lines have both horizontal section and vertical section on a same power line;
- at least one signal line on the first metal layer being routed between two adjacent power lines serving the first or second functional block; and
- a predetermined partition area disposed between the first and second functional blocks, wherein the at least one signal line on the first metal layer has one or more sections routed therein in both horizontal and vertical directions,
- wherein all the Vdd and Vss lines on the first metal layer serving the first functional block do not extend into the second functional block across the predetermined partition area, and all the Vdd and Vss lines on the first metal layer serving the second functional block do not extend into the first functional block across the predetermined partition area.

15. The memory chip of claim 14, wherein the functional blocks belong to a system-on-chip (SoC) and include analog circuit blocks, digital circuit blocks, and memory cell array blocks.

16. The memory chip of claim 14, wherein a line width of the signal line is less than about 0.3 um.

17. The memory chip of claim 14, wherein a width of the predetermined partition area is less than about 60 um.

18. The memory chip of claim 14, wherein a space between the Vdd and Vss lines is less than about 50 um.

* * * * *